United States Patent
Sicardy

(10) Patent No.: US 8,586,127 B2
(45) Date of Patent: Nov. 19, 2013

(54) CRYSTALLISATION METHOD WITH CONTROL OF THE ORIENTATION OF THE CRYSTAL GRAINS

(75) Inventor: Olivier Sicardy, Saint Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 617 days.

(21) Appl. No.: 12/690,414

(22) Filed: Jan. 20, 2010

(65) Prior Publication Data
US 2010/0203233 A1 Aug. 12, 2010

(30) Foreign Application Priority Data
Feb. 12, 2009 (FR) .................................. 09 50892

(51) Int. Cl.
*B05D 5/12* (2006.01)
(52) U.S. Cl.
USPC ............................................. 427/58
(58) Field of Classification Search
USPC .................. 427/379, 355, 346, 380, 372, 58;
148/112, 121, 510, 536, 553; 72/46,
72/47, 64, 69
See application file for complete search history.

(56) References Cited

U.S. PATENT DOCUMENTS 6,479,625 B1 * 11/2002 Moore ........................... 528/481
2010/0071810 A1 * 3/2010 Nadaud et al. ................ 148/400

FOREIGN PATENT DOCUMENTS

JP   2-239198   9/1990
SU   966122   * 10/1982

OTHER PUBLICATIONS

Paul R. Besser, et al., "Microstructural Characterization of Inlaid Copper Interconnect Lines", Journal of Electronic Materials, vol. 30, No. 4, XP008006449, Apr. 1, 2001, pp. 320-330.
G. Reimbold, et al., "Mechanical Stress Measurements in Damascene Copper Interconnects and Influence on Electromigration Parameters", IEEE Xplore; [International Electron Devices Meeting], XP010626148, Dec. 8, 2002, pp. 745-748.

* cited by examiner

*Primary Examiner* — Michael Cleveland
*Assistant Examiner* — Tabassom Tadayyon Eslami
(74) *Attorney, Agent, or Firm* — Oblon, Spivak, McClelland, Maier & Neustadt, L.L.P.

(57) ABSTRACT

A crystallization method, including: depositing a thin film of a crystalline material on a substrate; heating the substrate and the crystalline material deposited on the substrate to a first temperature for a time enabling internal strains present in the crystalline material to be relaxed; after the heating, subjecting the substrate and the crystalline material to a second temperature and to a uniform bending by placing the substrate on a bending bench, a quantity of bending and a difference between the first and the second temperature having values determined from elastic bending constants, thermal deformations and thermal expansion coefficients to favor a particular crystallographic orientation of the crystalline material along an azimuth direction in relation to a direction normal to the substrate.

3 Claims, 1 Drawing Sheet

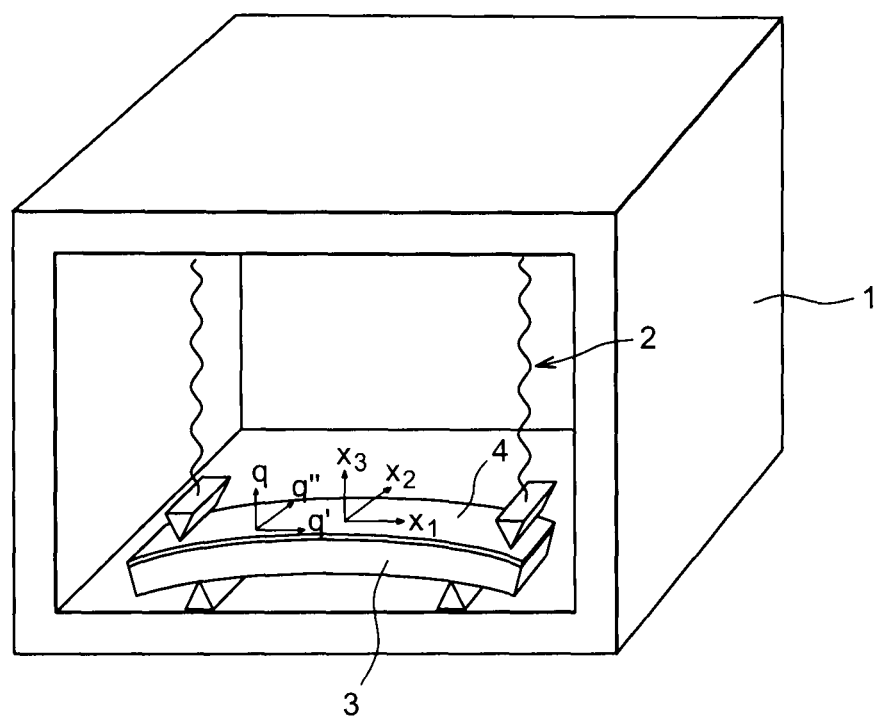

CRYSTALLISATION METHOD WITH CONTROL OF THE ORIENTATION OF THE CRYSTAL GRAINS

The invention relates to a crystallisation method, the essential feature of which is that the orientation of the crystal grains is controlled.

The orientation of the grains of the crystal is decided during its growth under the effect of numerous and complex phenomena, which moreover depend on the method used. Since the properties of the materials depend in general on the orientation of the grains, it may be useful to control said orientation. This concerns in particular electrical conductivity properties in thin films of copper or other conductive materials used in integrated circuits. In addition, it is often worthwhile maintaining a same crystallographic orientation of the grains over a large area of the crystal.

The prior art includes a certain number of works attempting to elucidate the mechanisms influencing the orientation of crystals, but it does not seem that a simple and general method of controlling the orientation of the grains has been proposed in the particular case of thin films at the surface of a substrate.

The fundamental object of the invention is to fill this gap. It relates to a crystallisation method, consisting in depositing at least partially the material of the crystal on a substrate in a thin film, heating the substrate and the material deposited on a substrate to a first temperature for a time enabling the internal strains present in the deposited material to be relaxed, then subjecting the substrate and said deposited material to a second temperature and to a uniform bending by placing the substrate on a bending bench, a quantity of bending and a difference between the first and the second temperatures having values determined from relations bringing into play elastic bending constants, thermal deformations and thermal expansion coefficients to favour a particular crystallographic orientation of the material deposited along an azimuth direction in relation to a direction normal to the substrate, by a simple rearrangement of the material.

BRIEF DESCRIPTION OF DRAWING

FIG. 1 is a schematic of a device for implementation of strain to a substrate.

DETAILED DESCRIPTION OF THE INVENTION

The invention will now be described by means of FIG. 1, which represents the device used for the implementation of the method. It involves a furnace 1 including a bending bench 2. A substrate 3 coated with a layer 4 of the material of the crystal is enclosed therein. According to the invention, a thin film is of thickness such that the deformations parallel to the surface of the substrate 3 are fully communicated to said layer over its whole thickness. In a first step, the substrate 3 and the layer 4 are heated to a uniform temperature for a time enabling the internal strains therein to be relaxed, since these internal strains would perturb the implementation of the method and they are generally high following the usual deposition methods. The applied temperature must however leave the material of the layer 4 solid. It may be around 300° C. for deposits of electrolytic copper on silicon substrates used for the elaboration of integrated circuits, and determined by calculation or by X-ray diffraction measurements.

A temperature difference, defined in relation to the previous temperature, is then applied to the substrate 3 and to the layer 4 at the same time as a bending by the bench 2. Strains of dual origin, bending and thermal expansion, appear. Their effects in the crystalline material of the layer 4 will now be explained by means of the mechanics of continuous media.

Beginning with the relation (1) ϵ total=ϵ applied+ϵ elastic, which expresses that, in the layer 4, the total deformations are the sum of the deformations applied by the external medium and internal elastic deformations. In the case of a cubic crystal, the system of equations (2) is obtained:

$$\underbrace{\begin{pmatrix} \beta_1 & 0 & 0 \\ 0 & \beta_2 & 0 \\ 0 & 0 & \beta \end{pmatrix}}_{\underline{\varepsilon}\text{ total}} = \underbrace{\begin{pmatrix} \alpha & 0 & 0 \\ 0 & \alpha & 0 \\ 0 & 0 & \alpha \end{pmatrix}}_{\underline{\varepsilon}\text{ applied}} + \underbrace{\begin{pmatrix} \varepsilon^e_{11} & \varepsilon^e_{12} & \varepsilon^e_{13} \\ \varepsilon^e_{12} & \varepsilon^e_{22} & \varepsilon^e_{23} \\ \varepsilon^e_{13} & \varepsilon^e_{23} & \varepsilon^e_{33} \end{pmatrix}}_{\underline{\varepsilon}\text{ elastic}}$$

in the principal mark defined by the vectors $x_1$, $x_2$ and $x_3$, where $x_1$ is in the length of the substrate 3 (along the applied curve), $x_2$ in the width and $x_3$ is normal to the surface on which the layer 4 has been deposited. The total deformations comprise three components, the first two of which are defined by the deformations on the upper face of the substrate 3 since the substrate 3, very thick compared to the layer 4, imposes on it its deformations, and are linked by the equation:

$$\beta_2 = -\nu\beta_1, \quad (3)$$

$\nu$ being the Poisson coefficient of the substrate.

The $\alpha$ components of the deformations applied are due to thermal expansions and depend on the corresponding coefficients. The thermal expansion of the substrate 3 is disregarded in the following calculations, but it can easily be taken into account by a modification of the total deformations, since this thermal expansion of the substrate 3 amounts to a condition at the limits. Furthermore, the components $\epsilon_{ij}$ represent the elastic deformations of the layer 4.

A new mark linked to the crystal is now introduced, formed of vectors $y_1$, $y_2$ and $y_3$, and vectors q', q" and q, which are unitary vectors identical to the vectors $x_1$, $x_2$ and $x_3$, but which are defined from the point of view of the layer 4. The coordinates of the directions q, q' and q" in the mark $(y_1, y_2, y_3)$ are noted $q_1$, $q_2$ and $q_3$; $q'_1$, $q'_2$ and $q'_3$; $q''_1$, $q''_2$, and $q''_3$ respectively.

In the mark $(y_1, y_2, y_3)$, the components $\epsilon^e_{11}$, $\epsilon^e_{22}$, $\epsilon^e_{33}$, $\epsilon^e_{23}$, $\epsilon^e_{13}$ and $\epsilon^e_{12}$ of (2), expressed in matrix notation $e_1$ to $e_6$, are equal to:

$$e_1 = -\alpha + \beta_1 Q'_1 + \beta_2 Q''_1 + \beta Q_1$$

$$e_2 = -\alpha + \beta_1 Q'_2 + \beta_2 Q''_2 + \beta Q_2$$

$$e_3 = -\alpha + \beta_1 Q'_3 + \beta_2 Q''_3 + \beta Q_3$$

$$e_4 = 2\beta_1 Q'_4 + 2\beta_2 Q''_4 + 2\beta Q_4$$

$$e_5 = 2\beta_1 Q'_5 + 2\beta_2 Q''_5 + 2\beta Q_5$$

$$e_6 = 2\beta_1 Q'_6 + 2\beta_2 Q''_6 + 2\beta Q_6 \quad (4)$$

with $Q_1 = q_1^2$, $Q_2 = q_1^2$, $Q_3 = q_3^2$, $Q_4 = q_2 q_3$, $Q_5 = q_3 q_1$, $Q_6 = q_1 q_2$, and likewise for the expressions of Q' and Q".

Hooke's law $\sigma = C\epsilon$, general and valid in the elastic domain of deformations, makes it possible to determine the strains tensor and particularly the strains vector $\sigma(q)$ that applies on the free surface of the layer 4. This gives the system of components (5) expressed in the mark linked to the crystal:

along $y_1$: $[-(C_{11}+2C_{12})\alpha+(AQ_1+C_{12})\beta+(AQ''_1+C_{12})\delta+ 2Aq_1q''_1\gamma]/q'_1$ along $y_2$: $[-(C_{11}+2C_{12})\alpha+(AQ_2+C_{12})\beta+(AQ''_2+C_{12})\delta+ 2Aq_2q''_2\gamma]/q'_2$ along $y_3$: $[-(C_{11}+2C_{12})\alpha+(AQ_3+C_{12})\beta+(AQ''_3+C_{12})\delta+ 2Aq_3q''_3\gamma]/q'_3$ The components $C_{ij}$ are those of the tensor of the elastic constants of the crystal considered:

$$\begin{pmatrix} C_{11} & C_{12} & C_{12} & 0 & 0 & 0 \\ C_{12} & C_{11} & C_{12} & 0 & 0 & 0 \\ C_{12} & C_{12} & C_{11} & 0 & 0 & 0 \\ 0 & 0 & 0 & C_{44} & 0 & 0 \\ 0 & 0 & 0 & 0 & C_{44} & 0 \\ 0 & 0 & 0 & 0 & 0 & C_{44} \end{pmatrix} \quad (6)$$

Yet the components of the system (5) must all be zero since the strain applying on a free surface is also zero. By adding these components member by member and by noting that the relations (7):

$$Q_1+Q_2+Q_3=1, Q'_1+Q'_2+Q'_3=1 \text{ and } Q''_1+Q''_2+Q''_3=1$$

apply, the vectors q, q' and q" being normal, finally the relation (8) is obtained:

$$-3(C_{11}+2C_{12})\alpha+(A+3C_{12})(\beta_1+\beta_2)+(A+3C_{12}+6C_{44})\beta=0$$

between $\alpha$, $\beta_1$ and $\beta$, which is independent of the choice of q, q' and q".

By using this relation in the mark linked to the crystal, the system (5) of components becomes the system (9):

$$\text{along } y_1: A\left[\left(Q'_1-\frac{1}{3}\right)\beta_1+\left(Q''_1-\frac{1}{3}\right)\beta_2+\left(Q_1-\frac{1}{3}\right)\beta\right]q_1$$

$$\text{along } y_2: A\left[\left(Q'_2-\frac{1}{3}\right)\beta_1+\left(Q''_2-\frac{1}{3}\right)\beta_2+\left(Q_2-\frac{1}{3}\right)\beta\right]q_2$$

with $\beta_2=-\nu\beta_1$ $$\text{along } y_3: A\left[\left(Q'_3-\frac{1}{3}\right)\beta_1+\left(Q''_3-\frac{1}{3}\right)\beta_2+\left(Q_3-\frac{1}{3}\right)\beta\right]q_3$$

to express the strain applying on the free surface of the layer 4 with $A=C_{11}-C_{12}-2C_{44}$.

The free surface condition $\sigma(q)=0$ is necessarily respected if the crystal is isotropic, since then $A=0$. Common crystalline materials have however in practice a degree of anisotropy, in such a way that it is the quantities in square brackets of the system (9) that must be zero.

The use of relations (7) makes it possible to simplify the system (9) and to obtain the system of equations (10):

$$\begin{cases} \left(Q'_1-\frac{1}{3}\right)(\beta_1-\beta_2)+\left(Q_1-\frac{1}{3}\right)(\beta-\beta_2)=0 \\ \left(Q'_2-\frac{1}{3}\right)(\beta_1-\beta_2)+\left(Q_2-\frac{1}{3}\right)(\beta-\beta_2)=0 \\ \left(Q'_3-\frac{1}{3}\right)(\beta_1-\beta_2)+\left(Q_3-\frac{1}{3}\right)(\beta-\beta_2)=0 \end{cases}$$

It only allows a solution for certain values of q and q' on account of orthogonality and normality strains of the vectors. In other words, the application of a bending deformation to the substrate 3 combined with a deformation of thermal origin of the layer 4 makes it possible on the one hand to limit the possible orientations of the crystal and on the other hand to direct it in azimuth since the expression of the coordinates of q' is determined by that of q.

Certain particular cases may be discerned. If q is parallel to the direction [111], $Q_1=Q_2=Q_3=\frac{1}{3}$, and from this is deduced $Q'_1=Q'_2=Q'_3=\frac{1}{3}$, in other words that q' is also parallel to [111] and thus merged with q, which is impossible. It is deduced from this that an anisotropic monocrystal from the elastic point of view cannot adopt a direction of growth of direction [111] from the moment that the substrate 3 is bent. This result is valid when the system of components (6) can be used, in other words for crystals with cubic symmetry; it should be noted that in the absence of bending, the direction of growth [111] is possible, just as are the directions of growth [110] and [100].

In a second particular case, $\beta_1$ and $\alpha$ is chosen so that $\beta=\beta_{2_2}$. The system (10) gives as solution $Q'_1=Q'_2=Q'_3=\frac{1}{3}$, and q is indeterminate. q' is thus of direction [111]. The monocrystal has an axis [111] parallel to the direction $x_1$.

In a third case, $\beta_1$ and $\alpha$ are chosen so that $\beta=\beta_1$, conversely one has $Q''_1=Q''_2=Q''_3=\frac{1}{3}$, and q still indeterminate. q" is thus of direction [111]. The monocrystal has an axis [111] parallel to the direction $x_2$. These two latter examples show that the crystals may be directed in azimuth around the direction $x_3$ orthogonal to the layer 4 according to the choices of $\beta_1$ and $\alpha$.

In the case of a layer of copper having a Poisson coefficient $\nu=0.33$, of elastic constants $C_{11}=169$ GPa, $C_{12}=122$ GPa, $C_{44}=76$ GPa and a thermal expansion coefficient equal to $16.10^{-6}$ K$^{-1}$, if the substrate is bent so that $\beta_1=3.10^{-3}$, the condition $\beta=\beta_1$ of the third particular case is obtained for $\alpha=2.16.10^{-3}$ i.e. $\Delta T=+135°$ C. and the condition $\beta_2$ of the second particular case for $\alpha=-0.156.10^{-3}$ i.e. $\Delta T=-10°$ C.

Other orientations in azimuth may be obtained with other temperature variations. The previous results have been obtained for situations where q1, q2 and q3 are all three non-zero. The vector q could have one or two zero components, and similar results would still be obtained. If for example $q_3=0$ and $q_1 \neq q_2$, if $\beta_1$ and $\alpha$ are chosen so that $\beta=\beta_2$, q' is the direction [001] and q ($\perp$ q') is indifferent. The axis [001] of the crystals is then oriented in the direction $x_1$. Likewise, if $\beta=\beta_1$, q" is of direction [001] and the corresponding axis of the crystal is in the direction $x_2$.

The previous results may be extrapolated to other crystals, the systems being only more complicated since the elasticity tensor then has less zero components $C_{ij}$ than the system (6). For example, the tensor of a monoclinic system is given by the system (11):

$$\begin{pmatrix} C_{11} & C_{12} & C_{13} & 0 & C_{15} & 0 \\ C_{12} & C_{22} & C_{23} & 0 & C_{25} & 0 \\ C_{13} & C_{23} & C_{33} & 0 & C_{35} & 0 \\ 0 & 0 & 0 & C_{44} & 0 & C_{46} \\ C_{15} & C_{25} & C_{35} & 0 & C_{55} & 0 \\ 0 & 0 & 0 & C_{46} & 0 & C_{66} \end{pmatrix}$$

In all cases, it is possible to direct the network of the crystal in azimuth around the direction orthogonal to the crystalline layer according to the corresponding temperature and bending.

The device should cover quite a wide temperature range, typically between ambient and 500° C. The bending bench 2 could be dimensioned to induce deformations of the order of several thousandths. The furnace 1 should be under vacuum or under neutral gas so as to avoid the oxidation of the treated layers.

The invention claimed is:

1. A crystallisation method, comprising:
   depositing a thin film of a conductive crystalline material on a substrate;
   heating the substrate and the crystalline material deposited on the substrate to a first temperature for a time enabling internal strains present in the crystalline material to be relaxed;
   after the heating, subjecting the substrate and said crystalline material to a second temperature and to a uniform bending by placing the substrate on a bending bench, a quantity of bending and a difference between the first and the second temperature having values determined from elastic bending constants thermal deformations and thermal expansion coefficients to favour a particular crystallographic orientation of the crystalline material along an azimuth direction in relation to a direction normal to the substrate which is defined by the system of equations:

$$\begin{cases} \left(Q'_1 - \frac{1}{3}\right)(\beta_1 - \beta_2) + \left(Q_1 - \frac{1}{3}\right)(\beta - \beta_2) = 0 \\ \left(Q'_2 - \frac{1}{3}\right)(\beta_1 - \beta_2) + \left(Q_2 - \frac{1}{3}\right)(\beta - \beta_2) = 0 \\ \left(Q'_3 - \frac{1}{3}\right)(\beta_1 - \beta_2) + \left(Q_3 - \frac{1}{3}\right)(\beta - \beta_2) = 0 \end{cases}$$

where $\beta_1$, $\beta_2$, and $\beta$ are total deformations underwent by the film in length, corresponding to a curvature related to the bending, width, and thickness directions in the film, and $Q_1$, $Q_2$, $Q_3$, $Q'_1$, $Q'_2$, $Q'_3$ are equal to $q_1^2$, $q_2^2$, $q_3^2$, $q'^2_1$, $q'2^2$, $q'^2_3$, respectively, where $q_1$, $q_2$, and $q_3$ are coordinates of unitary vectors ($x_1$ and $a_2$) oriented in said length and width directions, impressed in a reference ($y_1$, $y_2$, and $y_3$) of the crystal.

2. The method of claim 1, wherein the crystalline material is copper.

3. The method of claim 1, wherein the crystalline material is a conductive material used in integrated circuits.

\* \* \* \* \*